United States Patent
Lee

(10) Patent No.: US 7,161,853 B2
(45) Date of Patent: Jan. 9, 2007

(54) CIRCUIT FOR ACCESSING WORD LINE OF SEMICONDUCTOR DEVICE AND METHOD OF ACCESSING WORD LINE USING THE SAME

(75) Inventor: Yin Jae Lee, Icheon-Shi (KR)

(73) Assignee: Hynix Semiconductor Inc., Kyungki-do (KR)

( * ) Notice: Subject to any disclaimer, the term of this patent is extended or adjusted under 35 U.S.C. 154(b) by 146 days.

(21) Appl. No.: 10/880,175

(22) Filed: Jun. 29, 2004

(65) Prior Publication Data

US 2005/0232064 A1    Oct. 20, 2005

(30) Foreign Application Priority Data

Apr. 20, 2004   (KR)   ...................... 10-2004-0027104

(51) Int. Cl.
    *G11C 7/00*       (2006.01)
(52) U.S. Cl. ........................................ 365/193; 365/203
(58) Field of Classification Search ................ 365/233, 365/191, 203, 193
    See application file for complete search history.

(56) References Cited

U.S. PATENT DOCUMENTS

| 5,255,235 | A  | * | 10/1993 | Miyatake | .................... | 365/210 |
| 6,754,778 | B1 | * | 6/2004  | Sato     | .......................... | 711/133 |
| 6,947,348 | B1 | * | 9/2005  | Kim et al. | .................. | 365/233 |

* cited by examiner

*Primary Examiner*—M. Tran
(74) *Attorney, Agent, or Firm*—Marshall, Gerstein & Borun LLP

(57) ABSTRACT

Provided is directed to a method of accessing a word line of a semiconductor memory device, including the steps of: generating a word line active signal and an address strobe signal according to an active condition; receiving and decoding an address according to the address strobe signal; performing an active operation by accessing a word line in response to the word line active signal and the decoded address; holding after performing to decode a new address by receiving it during the active operation and another active operation; generating a precharge signal when a precharging condition is satisfied during a read operation; and accessing a new word line after performing the precharging operation according to the precharge signal.

7 Claims, 2 Drawing Sheets

CIRCUIT FOR ACCESSING WORD LINE OF SEMICONDUCTOR DEVICE AND METHOD OF ACCESSING WORD LINE USING THE SAME

This application relies for priority upon Korean Patent Application No. 2004-0027104 filed on Apr. 20, 2004, the contents of which are herein incorporated by reference in their entirety.

BACKGROUND

1. Field of the Invention

The present invention relates to a method of precharging a word line of a semiconductor memory device, and more particularly to, a method of precharging a word line capable of achieving a page mode embodiment and a speed improvement in a pseudo SRAM.

2. Discussion of Related Art

A semiconductor memory device is used in many kinds of applicable fields. As a result, according to each case, a definition to operation of a semiconductor memory device is differentiated to adapt for usage of each applicable field. For instance, a pseudo SRAM requires a less power consumption and a low operation frequency, relatively, comparing with the conventional SRAM in case of a main application circumstance.

As it is, during a read operation of the pseudo SRAM, when a corresponding word line is accessed and a sensing operation is completed by a sense amplifier, a precharge signal is generated. The corresponding word line is enabled according to the precharge signal and then an operation is performed to take an address for a new word line access operation from an address buffer. However, in order to operate a page read mode, a word line should have been enabled but the conventional technique takes the address from the address buffer only after precharging, so that it is disadvantageous to reduce a read speed.

It will be described about the conventional art with reference to FIGS. 1 and 2 in detail.

When a word line enable active condition is satisfied, an active command generation unit 60 generates a word line active signal wl_active.

The word line enable active condition is one of those as follows that 1) when a chip select signal CS1 is transited from high level to low level, 2) when an address is toggled, 3) when a write enable signal /WE is transited from low level to high level, 4) when a select signal of an upper memory block and/or a lower memory block UB and/or LB is transited from high level to low level, 5) when the write enable signal /WE is transited from high level to low level for the first time after a power up, 6) when a page address is toggled for the first time after the power up, and 7) after a refresh operation.

The word line active conditions are satisfied, an address strobe signal Address strobe is generated and then receives an address information entering into an address buffer 10. The address entered from the address buffer 10 is pre-decoded in a pre-decoder 20 and then is decoded by a decoder 30. Also, the word line active signal wl_active delayed in a delay unit 40 is enabled and thus a word line W/L is accessed.

After the active condition is satisfied and then another operation, that is, a refresh or the aforementioned active condition is entered, if a new active condition is satisfied, the word line enable signal wl_active is generated and then the address strobe signal Address strobe isn't immediately generated. After a precharge signal PCG is generated, the word line W/L access operation is achieved by completing pre-decoding and decoding operations and enabling the word line enable signal wl_active by means of receiving a new address according to the address strobe signal Address strobe.

Referring to FIG. 2, as soon as a sense delay signal sensedly is generated after a sensing operation during a read operation, the precharge signal PCG is generated in a precharge signal generation unit 50. The precharge signal PCG disables the previous word line. In this case, although the new active condition is satisfied, the precharge signal PCG has disabled the word line (that is, a page is closed), by which cause the page read operation not to be performed. Additionally, it is disadvantageous that a speed is not fast because the operation taking the address is possibly performed after the precharge operation.

SUMMARY OF THE INVENTION

The present invention is directed to provide a method of precharging a word line in a semiconductor memory device which can solve those disadvantages by means of generating a precharge signal for disabling a previous word line only when a word line access condition is satisfied without precharging a word line by itself during a read operation, and also achieving an operation to take an address when an access command is received regardless of the precharge signal.

One aspect of the present invention is to provide a method of accessing a word line of a semiconductor memory device which includes the steps of: generating a word line active signal and an address strobe signal according to an active condition; receiving and decoding an address according to the address strobe signal; performing an active operation by accessing a word line in response to the word line active signal and the decoded address; holding after performing to decode a new address by receiving it during the active operation and another active operation; generating a precharge signal when a precharging condition is satisfied during a read operation; and accessing a new word line after performing the precharging operation according to the precharge signal.

BRIEF DESCRIPTION OF THE DRAWINGS

A more complete understanding of the present invention may be had by reference to the following description when taken in conjunction with the accompanying drawings in which.

DETAILED DESCRIPTION OF PREFERRED EMBODIMENTS

Hereinafter, it will be described about embodiments in accordance with the present invention with reference to the accompanying drawings.

Figure 1:
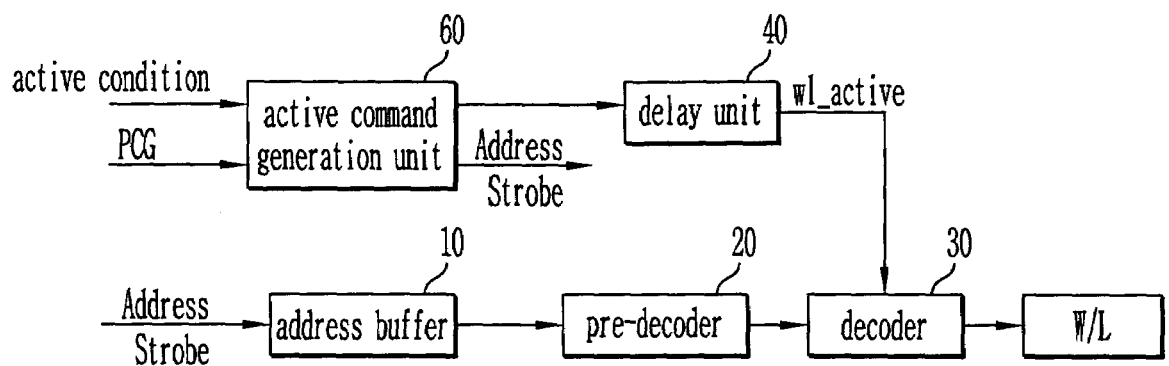
FIG. 1 is a block diagram illustrating a method of accessing a word line in the conventional art.
Figure 2:
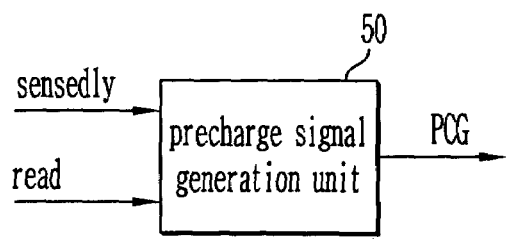
FIG. 2 is a block diagram illustrating a generation of a precharge signal of FIG. 1.
Figure 3:
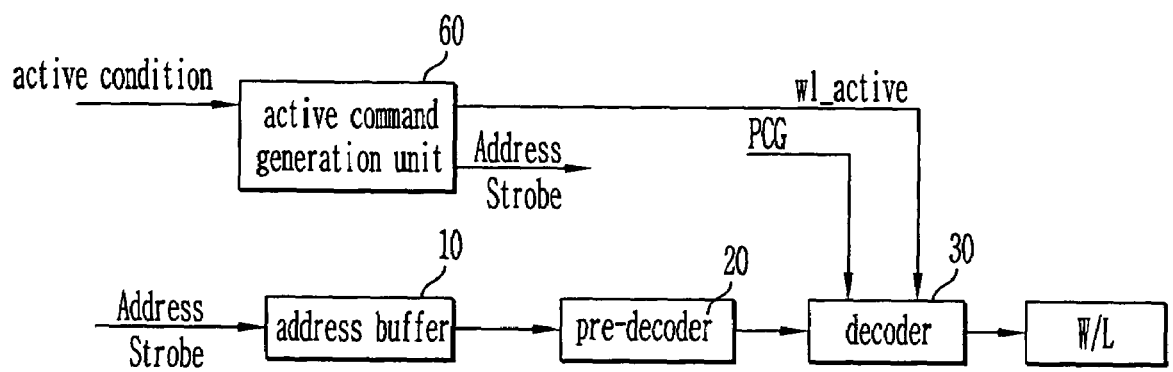
FIG. 3 is a block diagram illustrating a method of accessing a word line in accordance with the present invention.

FIG. 3 is a block diagram illustrating a method of accessing a word line in a semiconductor memory device in accordance with the present invention.

When a word line enable active condition is satisfied, a word line active signal wl_active is generated in an active command generation unit 60.

The word line enable active condition is as follows that 1) when a chip select signal CS1 is transited from high level to low level, 2) when an address is toggled, 3) when a write enable signal /WE is transited from low level to high level, 4) when a select signal of an upper memory block and/or a lower memory block UB and/or LB is transited from high level to low level, 5) when the write enable signal /WE is transited from high level to low level for the first time after a power up, 6) when a page address is toggled for the first time after the power up, and 7) after a refresh operation.

When those word line enable active conditions are received from the external of the device, an address strobe signal Address strobe is generated and then an address information entered into an address buffer 10 is received. After the address from the address buffer 10 is pre-decoded in a pre-decoder 20 and then the pre-decoded address is decoded by a decoder 30 in response to the word line active signal wl_active. As a result, the word line W/L is enabled according to an output of the decoder 30.

After those active operations are completed and then another operation, that is, a refresh or the aforementioned active condition is entered, if a new active condition is satisfied, the word line enable signal wl_active is generated, which results to immediately generate the address strobe signal Address strobe. The pre-decoding and the decoding operations are completed and standbys by receiving a new address in response to the address strobe signal Address strobe. During this, when the precharge signal PCG is generated, a new word line W/L accessing operation is achieved by disabling the previous word line and enabling the word line enable signal wl_active.

Figure 4:
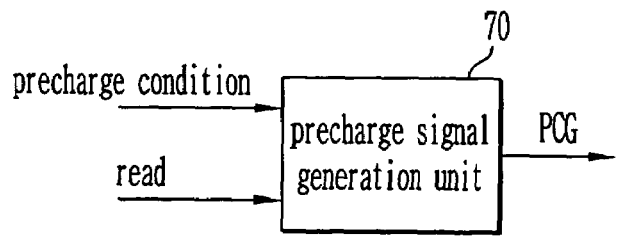
FIG. 4 is a block diagram illustrating a generation of a precharge signal of FIG. 3.

FIG. 4 is a block diagram for generating a precharge signal.

During a read operation, if the precharging conditions, that is, 1) when a chip select signal CS1 is transited from low level to high level, 2) when an address is toggled, 3) when a select signal of an upper memory block and/or a lower memory block is transited from low level to high level, 4) when a word line enable signal /WE is transited from low level to high level, and 5) after a refresh operation, are satisfied, a precharge signal PCG is generated in a precharge signal generation unit 70 after an active operation. Accordingly, the previous word line is disabled according to the precharge signal PCG. At this moment, a new word line becomes an enable state (a page opened state) and thus a page read operation is possibly performed.

That is, in order to perform the page operation during a read operation, it is available to generate a precharge signal disabling the previous word line only under the word line access conditions without precharging the word line by itself. Moreover, as the operation to take the address is possible to be performed only with an access command regardless of the precharge signal, it is also advantageous to reduce time taken by pre-decoding during the operation to take the address.

As described earlier, the present invention can make available to perform a page read operation and also improve an operation speed of a memory device by reducing time spent from an operation to take an address up to a pre-decoding.

Although the present invention has been described in connection with the embodiment of the present invention illustrated in the accompanying drawings, it is not limited thereto. It will be apparent to those skilled in the art that various substitutions, modifications and changes may be made thereto without departing from the scope and spirit of the invention.

What is claimed is:

1. A method of accessing a word line of a semiconductor memory device, comprising the steps of:
   generating a first word line active signal and a first address strobe signal according to a first active condition;
   receiving and decoding a first address according to the first address strobe signal;
   performing an active operation by accessing a first word line in response to the first word line active signal and a first decoded address;
   generating a second word line active signal and a second address strobe signal when a second active condition is satisfied after the active operation is completed;
   holding after performing to decode a second address according to the second address strobe signal;
   generating a precharge signal when a precharging condition is satisfied during a read operation; and
   disabling the first word line according to the precharge signal and then accessing a second word line in response to the second word line active signal and a second decoded address.

2. The method of accessing a word line of a semiconductor memory device of claim 1, wherein the active condition is one of these:
   when a chip select signal is transited from high level to low level;
   when an address is toggled;
   when a write enable signal is transited from low level to high level;
   when a select signal of an upper memory block and/or a lower memory block is transited from high level to low level;
   when a write enable signal is transited from high level to low level for the first time after a power up;
   when a page address is toggled for the first time after the power up; and
   after a refresh operation.

3. The method of accessing a word line of a semiconductor memory device of claim 1, wherein the precharging condition is one of these:
   when a chip select signal is transited from low level to high level;
   when an address is toggled;
   when a select signal of an upper memory block and/or a lower memory block is transited from low level to high level;
   when a word line enable signal is transited from low level to high level; and
   after a refresh operation.

4. A circuit for accessing word line of semiconductor device, comprising:
   an active command generation unit for generating a word line active signal and an address strobe signal when an active condition is satisfied;
   an address buffer for receiving an address in response to the address strobe signal; and
   a decoder for decoding the address outputted from the address buffer and for enabling a word line corresponding to a decoded address in response to a precharge signal, wherein the decoder decodes the address before the precharge signal is inputted to the decoder, and then enables the word line when the precharge signal is inputted to the decoder.

5. The circuit for accessing a word line of a semiconductor memory device of claim 4, wherein the active condition is one of these:
   when a chip select signal is transited from high level to low level;
   when an address is toggled;
   when a write enable signal is transited from low level to high level;
   when a select signal of an upper memory block and/or a lower memory block is transited from high level to low level;
   when a write enable signal is transited from high level to low level for the first time after a power up;
   when a page address is toggled for the first time after the power up; and
   after a refresh operation.

6. The circuit for accessing a word line of a semiconductor memory device of claim 4, further comprising a precharge signal generation unit for generating the precharge signal when a precharging condition is satisfied during a read operation.

7. The circuit for accessing a word line of a semiconductor memory device of claim 4, wherein the precharging condition is one of these:
   when a chip select signal is transited from low level to high level;
   when an address is toggled;
   when a select signal of an upper memory block and/or a lower memory block is transited from low level to high level;
   when a word line enable signal is transited from low level to high level; and
   after a refresh operation.

* * * * *